United States Patent
Chen

(10) Patent No.: US 9,105,355 B2
(45) Date of Patent: Aug. 11, 2015

(54) MEMORY CELL ARRAY OPERATED WITH MULTIPLE OPERATION VOLTAGE

(71) Applicant: UNITED MICROELECTRONICS CORPORATION, Hsinchu (TW)

(72) Inventor: Hsin-Wen Chen, Kaohsiung (TW)

(73) Assignee: United Microelectronics Corporation, Hsinchu (TW)

( * ) Notice: Subject to any disclaimer, the term of this patent is extended or adjusted under 35 U.S.C. 154(b) by 159 days.

(21) Appl. No.: 13/935,487

(22) Filed: Jul. 4, 2013

(65) Prior Publication Data

US 2015/0009749 A1    Jan. 8, 2015

(51) Int. Cl.
| | | |
|---|---|---|
| G11C 11/41 | (2006.01) | |
| G11C 11/417 | (2006.01) | |
| G11C 11/412 | (2006.01) | |
| G11C 11/413 | (2006.01) | |
| G11C 7/12 | (2006.01) | |

(52) U.S. Cl.
CPC .............. *G11C 11/417* (2013.01); *G11C 7/12* (2013.01); *G11C 11/412* (2013.01); *G11C 11/413* (2013.01)

(58) Field of Classification Search
CPC ... G11C 11/412; G11C 11/413; G11C 11/419
See application file for complete search history.

(56) References Cited

U.S. PATENT DOCUMENTS

| | | | |
|---|---|---|---|
| 3,663,828 A | 5/1972 | Low | |
| 3,818,402 A | 6/1974 | Golaski | |
| 4,163,944 A | 8/1979 | Chambers | |
| 4,245,355 A | 1/1981 | Pascoe | |
| 4,409,608 A | 10/1983 | Yoder | |
| 4,816,784 A | 3/1989 | Rabjohn | |
| 5,159,205 A | 10/1992 | Gorecki | |
| 5,208,725 A | 5/1993 | Akcasu | |
| 5,212,653 A | 5/1993 | Tanaka | |
| 5,406,447 A | 4/1995 | Miyazaki | |
| 5,446,309 A | 8/1995 | Adachi | |
| 5,583,359 A | 12/1996 | Ng | |
| 5,637,900 A | 6/1997 | Ker | |
| 5,760,456 A | 6/1998 | Grzegorek | |
| 5,808,330 A | 9/1998 | Rostoker | |
| 5,923,225 A | 7/1999 | De Los Santos | |
| 5,959,820 A | 9/1999 | Ker | |
| 6,008,102 A | 12/1999 | Alford | |
| 6,081,146 A | 6/2000 | Shiochi | |
| 6,172,378 B1 | 1/2001 | Hull | |
| 6,194,739 B1 | 2/2001 | Ivanov | |
| 6,246,271 B1 | 6/2001 | Takada | |
| 6,285,578 B1 | 9/2001 | Huang | |
| 6,291,872 B1 | 9/2001 | Wang et al. | |

(Continued)

*Primary Examiner* — Vanthu Nguyen
(74) *Attorney, Agent, or Firm* — Ding Yu Tan

(57) ABSTRACT

A memory cell array includes a bit line, a complementary bit line, a first operation voltage supply circuit, a second operation voltage supply circuit, a first memory cell and a second memory cell. The first operation voltage supply circuit is electrically coupled to the bit line and the complementary bit line and used for supplying a first operation voltage. The second operation voltage supply circuit is electrically coupled to the bit line and the complementary bit line and used for supplying a second operation voltage. The first memory cell is electrically coupled to the bit line and the complementary bit line and used for receiving the first operation voltage. The second memory cell is electrically coupled to the bit line and the complementary bit line and used for receiving the second operation voltage. The first and second memory cells are located in a same column in the memory cell array.

5 Claims, 7 Drawing Sheets

(56) References Cited

U.S. PATENT DOCUMENTS

| | | |
|---|---|---|
| 6,370,372 B1 | 4/2002 | Molnar |
| 6,407,412 B1 | 6/2002 | Iniewski |
| 6,427,226 B1 | 7/2002 | Mallick |
| 6,448,858 B1 | 9/2002 | Helms |
| 6,452,442 B1 | 9/2002 | Laude |
| 6,456,221 B2 | 9/2002 | Low |
| 6,461,914 B1 | 10/2002 | Roberts |
| 6,480,137 B2 | 11/2002 | Kulkarni |
| 6,483,188 B1 | 11/2002 | Yue |
| 6,486,765 B1 | 11/2002 | Katayanagi |
| 6,509,805 B2 | 1/2003 | Ochiai |
| 6,518,165 B1 | 2/2003 | Yoon |
| 6,521,939 B1 | 2/2003 | Yeo |
| 6,545,547 B2 | 4/2003 | Fridi |
| 6,560,306 B1 | 5/2003 | Duffy |
| 6,588,002 B1 | 7/2003 | Lampaert |
| 6,593,838 B2 | 7/2003 | Yue |
| 6,603,360 B2 | 8/2003 | Kim |
| 6,608,363 B1 | 8/2003 | Fazelpour |
| 6,611,223 B2 | 8/2003 | Low |
| 6,625,077 B2 | 9/2003 | Chen |
| 6,630,897 B2 | 10/2003 | Low |
| 6,639,298 B2 | 10/2003 | Chaudhry |
| 6,653,868 B2 | 11/2003 | Oodaira |
| 6,668,358 B2 | 12/2003 | Friend |
| 6,700,771 B2 | 3/2004 | Bhattacharyya |
| 6,720,608 B2 | 4/2004 | Lee |
| 6,724,677 B1 | 4/2004 | Su |
| 6,756,656 B2 | 6/2004 | Lowther |
| 6,795,001 B2 | 9/2004 | Roza |
| 6,796,017 B2 | 9/2004 | Harding |
| 6,798,011 B2 | 9/2004 | Adan |
| 6,810,242 B2 | 10/2004 | Molnar |
| 6,822,282 B2 | 11/2004 | Randazzo |
| 6,822,312 B2 | 11/2004 | Sowlati |
| 6,833,756 B2 | 12/2004 | Ranganathan |
| 6,841,847 B2 | 1/2005 | Sia |
| 6,847,572 B2 | 1/2005 | Lee |
| 6,853,272 B1 | 2/2005 | Hughes |
| 6,876,056 B2 | 4/2005 | Tilmans |
| 6,885,534 B2 | 4/2005 | Ker |
| 6,901,126 B1 | 5/2005 | Gu |
| 6,905,889 B2 | 6/2005 | Lowther |
| 6,909,149 B2 | 6/2005 | Russ |
| 6,927,664 B2 | 8/2005 | Nakatani |
| 6,958,522 B2 | 10/2005 | Clevenger |
| 7,009,252 B2 | 3/2006 | Lin |
| 7,027,276 B2 | 4/2006 | Chen |
| 7,205,612 B2 | 4/2007 | Cai |
| 7,262,069 B2 | 8/2007 | Chung |
| 7,365,627 B2 | 4/2008 | Yen |
| 7,368,761 B1 | 5/2008 | Lai |
| 7,405,642 B1 | 7/2008 | Hsu |
| 7,447,058 B2 * | 11/2008 | Maki et al. .................... 365/154 |
| 7,502,275 B2 * | 3/2009 | Nii et al. ....................... 365/226 |
| 7,672,100 B2 | 3/2010 | Van Camp |
| 7,715,223 B2 * | 5/2010 | Maeda et al. ................. 365/154 |
| 7,869,263 B2 * | 1/2011 | Lih et al. ....................... 365/154 |
| 8,072,799 B2 | 12/2011 | Maeda |
| 8,441,842 B2 * | 5/2013 | Rachamadugu et al. ..... 365/154 |
| 2002/0019123 A1 | 2/2002 | Ma |
| 2002/0036545 A1 | 3/2002 | Fridi |
| 2002/0188920 A1 | 12/2002 | Lampaert |
| 2003/0076636 A1 | 4/2003 | Ker |
| 2003/0127691 A1 | 7/2003 | Yue |
| 2003/0183403 A1 | 10/2003 | Kluge |
| 2005/0068112 A1 | 3/2005 | Glenn |
| 2005/0068113 A1 | 3/2005 | Glenn |
| 2005/0087787 A1 | 4/2005 | Ando |
| 2006/0006431 A1 | 1/2006 | Jean |
| 2006/0108694 A1 | 5/2006 | Hung |
| 2006/0267102 A1 | 11/2006 | Cheng |
| 2007/0102745 A1 | 5/2007 | Hsu |
| 2007/0210416 A1 | 9/2007 | Hsu |
| 2007/0234554 A1 | 10/2007 | Hung |
| 2007/0246801 A1 | 10/2007 | Hung |
| 2007/0249294 A1 | 10/2007 | Wu |
| 2007/0296055 A1 | 12/2007 | Yen |
| 2008/0094166 A1 | 4/2008 | Hsu |
| 2008/0185679 A1 | 8/2008 | Hsu |
| 2008/0189662 A1 | 8/2008 | Nandy |
| 2008/0200132 A1 | 8/2008 | Hsu |
| 2008/0299738 A1 | 12/2008 | Hsu |
| 2008/0303623 A1 | 12/2008 | Hsu |
| 2009/0029324 A1 | 1/2009 | Clark |
| 2009/0201625 A1 | 8/2009 | Liao |
| 2010/0279484 A1 | 11/2010 | Wang |
| 2012/0195135 A1 * | 8/2012 | Kawasumi ............... 365/189.06 |

* cited by examiner

MEMORY CELL ARRAY OPERATED WITH MULTIPLE OPERATION VOLTAGE

FIELD OF THE INVENTION

The present invention relates to a memory technique field, and more particularly to a memory cell array.

BACKGROUND OF THE INVENTION

Basically, a general memory device is constituted by a memory cell array and an operation voltage supply circuit. In the memory cell array, all the memory cells in the same row are electrically coupled to a respective write word line; and all the memory cells in the same column are electrically coupled to a respective bit line. The operation voltage supply circuit is configured to provide an operation voltage to all the memory cells in the same column in the memory cell array.

However, in the memory cell array, because all the memory cells in the same column are electrically coupled to one another, the bit line in the same column may have an increasing load while the memory cells in the same column are supplied with the operation voltage. Thus, an IR-Drop may occur, and consequently the memory cells may have a poor static noise margin (SNM) in the data writing period.

SUMMARY OF THE INVENTION

An object of the present invention is to provide a memory cell array having higher memory cell static noise margin (SNM).

The present invention provides a memory cell array, which includes a write bit line, a complementary bit line, a first operation voltage supply circuit, a second operation voltage supply circuit, a first memory cell and a second memory cell. The first operation voltage supply circuit, electrically coupled to the bit line and the complementary bit line, is configured to provide a first operation voltage. The second operation voltage supply circuit, electrically coupled to the bit line and the complementary bit line, is configured to provide a second operation voltage. The first memory cell, electrically coupled to the bit line and the complementary bit line, is configured to receive the first operation voltage. The second memory cell, electrically coupled to the bit line and the complementary bit line, is configured to receive the second operation voltage. Wherein, the first and second memory cells are located in a same column in the memory cell array.

In summary, by dividing the memory cells in the same column of a memory cell array into at least two groups of memory cells, configuring one of the two groups of memory cells to receive an operation voltage provided by one of the at least two groups of operation voltage supply circuits in the memory cell array, and configuring the other one of the two groups of memory cells to receive an operation voltage provided by the other one of the at least two groups of operation voltage supply circuits in the memory cell array, the memory cell array of the present invention employing the aforementioned structure not only can reduce the impact of the IR-Drop on the memory cells but also enhance the static noise margin (SNM) of the memory cells.

BRIEF DESCRIPTION OF THE DRAWINGS

The present invention will become more readily apparent to those ordinarily skilled in the art after reviewing the following detailed description and accompanying drawings, in which.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
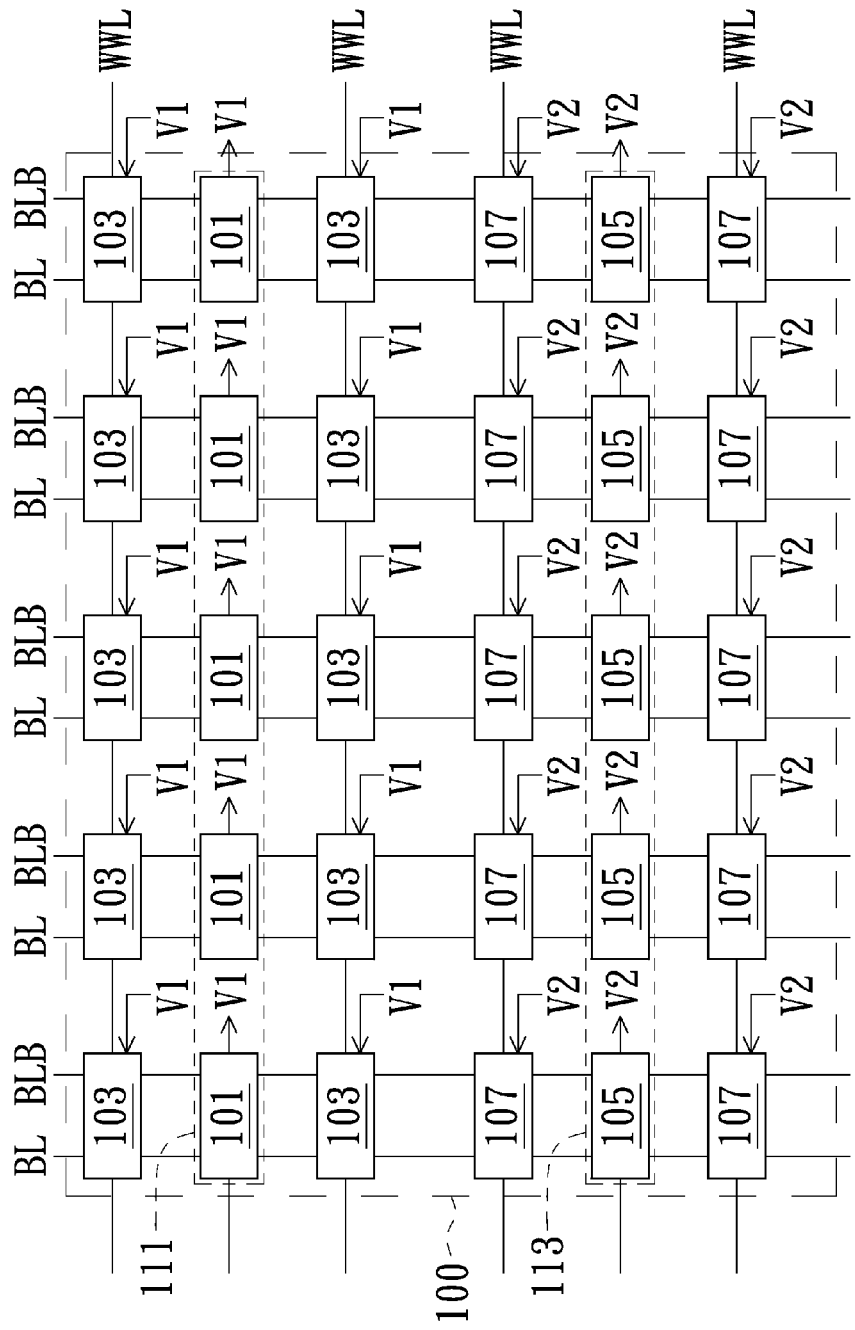
FIG. 1 is an illustrative view of a memory cell array in accordance with an embodiment of the present invention.

FIG. 1 is an illustrative view of a memory cell array in accordance with an embodiment of the present invention. As shown, a memory cell array 100 in this embodiment includes at least one bit line BL, at least one complementary bit line BLB, at least two groups of operation voltage supply circuits, at least two groups of memory cells and at least one write word line. In the memory cell array 100, one group of a plurality of operation voltage supply circuits 101 and one group of memory cells 103 both are electrically coupled to the bit line BL and the complementary bit line BLB; wherein each one of the memory cells 103 is configured to receive an operation voltage V1 supplied from one respective operation voltage supply circuit 101. Another group of a plurality of operation voltage supply circuits 105 and another group of a plurality of memory cells 107 both are electrically coupled to the bit line BL and the complementary bit line BLB; wherein each one of the memory cells 107 is configured to receive an operation voltage V2 supplied from one respective operation voltage supply circuit 105. The memory cells 103, 107 both are electrically coupled to the write word lines. In this embodiment, the specific memory cells 103 and the respective memory cells 107 are located in the same column in the memory cell array 100. Moreover, in this embodiment, the one group of the operation voltage supply circuits 101 is disposed in an array interstice 111 in the memory cell array 100; and the another group of the operation voltage supply circuits 105 is disposed in an array interstice 113 in the memory cell array 100.

The operation of the memory cell array 100 will be exemplarily described by using one operation voltage supply circuit 101 and one respective memory cell 103 only. Because the operation voltage supply circuit 105 and the respective memory cell 107 corporately have the similar operation, no redundant detail is to be given herein.

Figure 2:
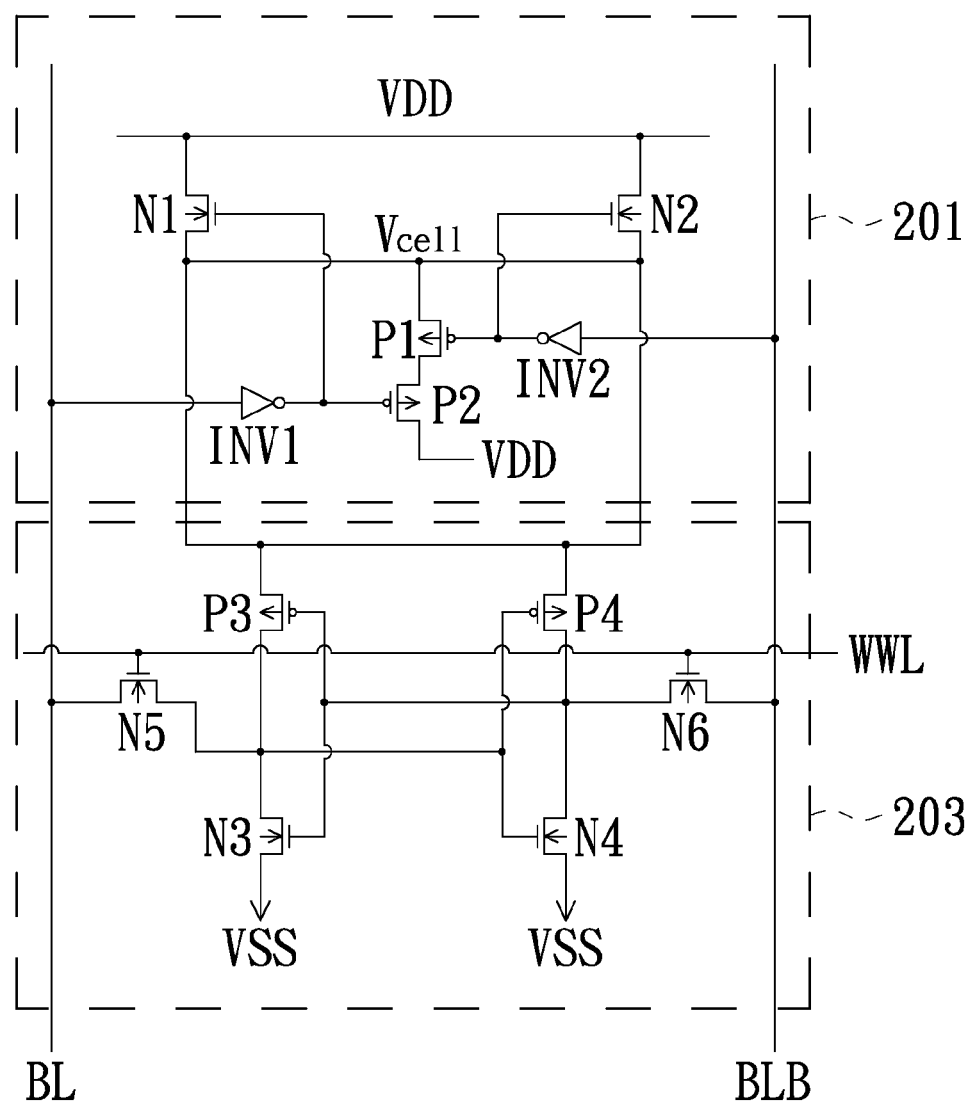
FIG. 2 is a schematic diagram of an operation voltage supply circuit and a respective memory cell in accordance with an embodiment of the present invention.

FIG. 2 is a schematic diagram of an operation voltage supply circuit 201 and a memory cell 203 in accordance with an embodiment of the present invention; wherein the operation voltage supply circuit 201 and the memory cell 203 herein are equivalent to the operation voltage supply circuit 101 and the memory cell 103 in FIG. 1, respectively. As shown in FIG. 2, the operation voltage supply circuit 201 mainly includes two N-type transistors N1, N2, two P-type transistors P1, P2, and two inverters INV1, INV2. The N-type transistors N1, N2 each is configured to have one source/drain thereof electrically coupled to a source voltage VDD and another source/drain thereof electrically coupled to a node for generating an operation voltage Vcell. The P-type transistor P1 is configured to have one source/drain thereof electrically coupled to the node and a gate thereof electrically coupled to a gate of the N-type transistor N2. The P-type transistor P2 is configured to have one source/drain thereof electrically coupled to another source/drain of the P-type transistor P1, another source/drain thereof electrically coupled to the source voltage VDD, and a gate thereof electrically coupled to a gate of the N-type transistor N1. The inverter INV1 is configured to have an input terminal thereof electrically coupled to the bit line BL and an output terminal thereof electrically coupled to a gate of the P-type transistor P2. The inverter INV2 is configured to have an input terminal thereof electrically coupled to a complementary bit line BLB and an output terminal thereof electrically coupled to a gate of the P-type transistor P1. In this embodiment, the N-type transistors N1, N2 each may be implemented by a general-threshold-voltage transistor, a high-threshold-voltage transistor or a low-threshold-voltage transistor.

The memory cell 203 mainly includes two P-type transistors P3, P4 and four N-type transistors N3, N4, N5 and N6. The P-type transistors P3, P4 each are configured to have one source/drain thereof electrically coupled to the node in the operation voltage supply circuit 201 and from which to receive the operation voltage Vcell. The N-type transistor N3 is configured to have one source/drain thereof electrically coupled to another source/drain of the P-type transistor P3, another source/drain thereof electrically coupled to a source voltage VSS, and a gate thereof electrically coupled to a gate of the P-type transistor P3. The N-type transistor N4 is configured to have one source/drain thereof electrically coupled to another source/drain of the P-type transistor P4, another source/drain thereof electrically coupled to the source voltage VSS, and a gate thereof electrically coupled to a gate of the P-type transistor P4. The N-type transistor N5 is configured to have one source/drain thereof electrically coupled to the bit line BL, another source/drain thereof electrically coupled to one source/drain of the N-type transistor N3 and a gate of the N-type transistor N4, and a gate thereof electrically coupled to the write word line WWL. The N-type transistor N6 is configured to have one source/drain thereof electrically coupled to the complementary bit line BLB, another source/drain thereof electrically coupled to one source/drain of the N-type transistor N4 and a gate of the N-type transistor N3, and a gate thereof electrically coupled to the write word line WWL. In this embodiment, the source voltage VDD is greater than the operation voltage Vcell; and the operation voltage Vcell is greater than the source voltage VSS.

Specifically, if both of the N-type transistors N1, N2 in the operation voltage supply circuit 201 are implemented by a general-threshold-voltage transistor, the memory cell 203 is configured to receive an operation voltage about VDD-0.7V while being operated in a data write period. If both of the N-type transistors N1, N2 in the operation voltage supply circuit 201 are implemented by a high-threshold-voltage transistor, the memory cell 203 is configured to receive an operation voltage less than VDD-0.7V while being operated in a data write period. If both of the N-type transistors N1, N2 in the operation voltage supply circuit 201 are implemented by a low-threshold-voltage transistor, the memory cell 203 is configured to receive an operation voltage greater than VDD-0.7V while being operated in a data write period. In other words, the operation voltage Vcell received by the memory cell 203 may vary in accordance with the type of threshold-voltage transistor adopted in the N-type transistors N1, N2.

Figure 3:
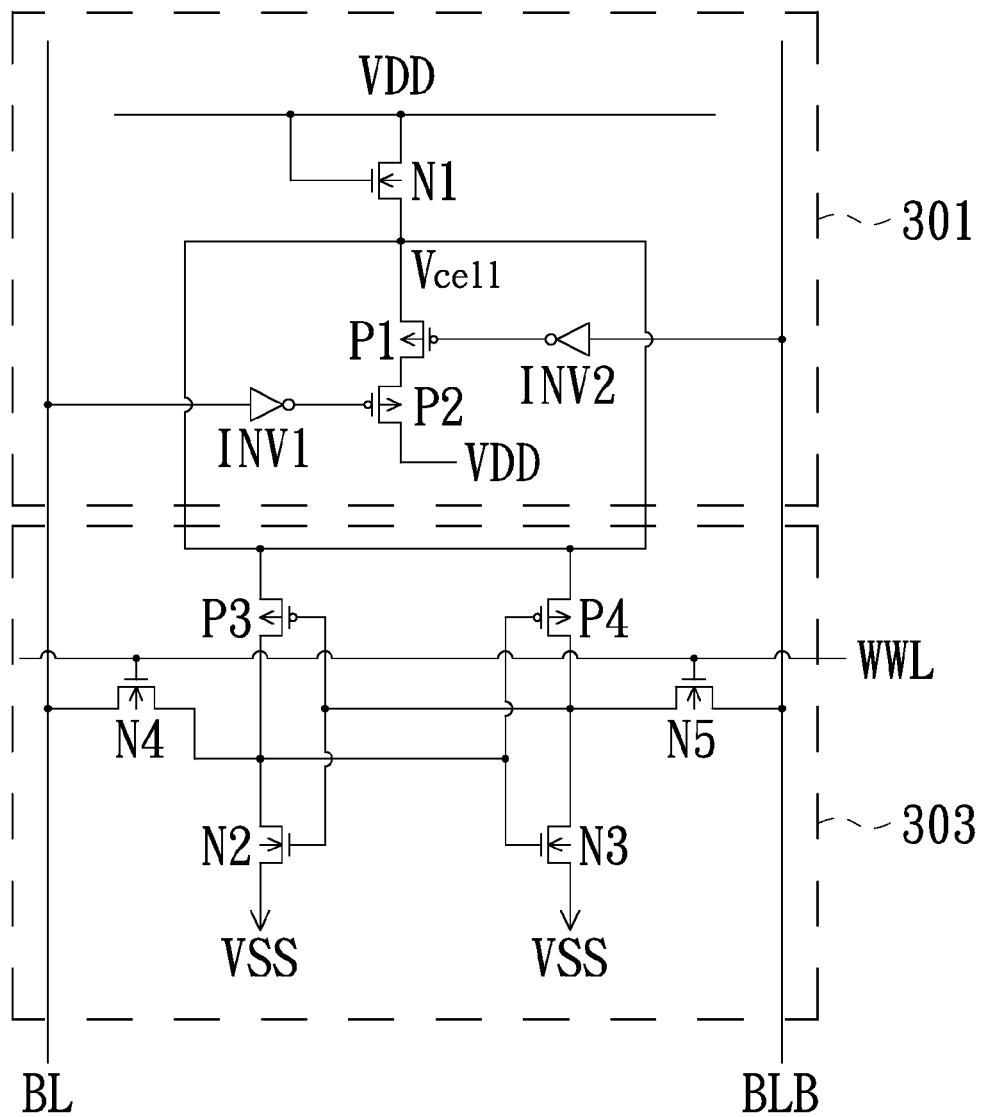
FIG. 3 is a schematic diagram of an operation voltage supply circuit and a respective memory cell in accordance with another embodiment of the present invention.

FIG. 3 is a schematic diagram of an operation voltage supply circuit 301 and a respective memory cell 303 in accordance with another embodiment of the present invention; wherein the operation voltage supply circuit 301 and the memory cell 303 herein are equivalent to the operation voltage supply circuit 101 and the memory cell 103 in FIG. 1, respectively. As shown, the circuit structure shown in FIG. 3 is similar to that in FIG. 2. The main difference between the two circuit structures is that the operation voltage supply circuit 201 in FIG. 2 is constituted by two N-type transistors, two P-type transistors and two inverters but the operation voltage supply circuit 301 in FIG. 3 is constituted by one N-type transistor, two P-type transistors and two inverters. Specifically, in the operation voltage supply circuit 301, the N-type transistor N1 is configured to have one source/drain and a gate thereof electrically coupled to a source voltage VDD and another source/drain thereof electrically coupled to a node for generating an operation voltage Vcell. The P-type transistor P1 is configured to have one source/drain thereof electrically coupled to the node. The P-type transistor P2 is configured to have one source/drain thereof electrically coupled to another source/drain of the P-type transistor P1 and another source/drain thereof electrically coupled to the source voltage VDD. The inverter INV1 is configured to have an input terminal thereof electrically coupled to the bit line BL and an output terminal thereof electrically coupled to a gate of the P-type transistor P2. The inverter INV2 is configured to have an input terminal thereof electrically coupled to the complementary bit line BLB and an output terminal thereof electrically coupled to a gate of the P-type transistor P1. In this embodiment, the source voltage VDD is greater than the operation voltage Vcell.

The memory cell 303 has a circuit structure similar to that of the memory cell 203 in FIG. 2. As shown, the memory cell 303 includes two P-type transistors P3, P4 and four N-type transistor N2, N3, N4 and N5; wherein the operations and circuit connections of these components in the memory cell 303 can be obtained by referring to the descriptions related to FIG. 2, and no redundant detail is to be given herein. In addition, it is to be noted that the N-type transistor N1 herein may be implemented by a general-threshold-voltage transistor, a high-threshold-voltage transistor or a low-threshold-voltage transistor.

Figure 4:
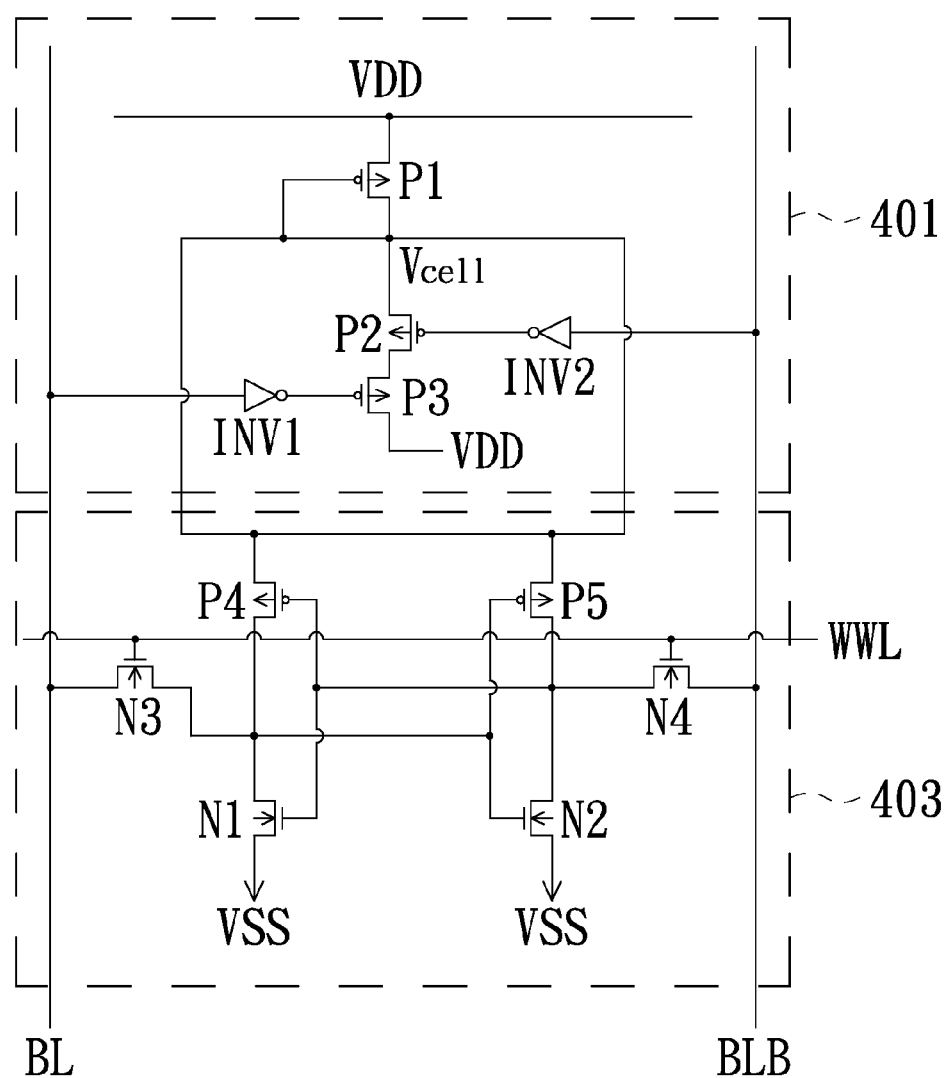
FIG. 4 is a schematic diagram of an operation voltage supply circuit and a respective memory cell in accordance with yet another embodiment of the present invention.

FIG. 4 is a circuit diagram of an operation voltage supply circuit 401 and a respective memory cell 403 in accordance with yet another embodiment of the present invention; wherein the operation voltage supply circuit 401 and the memory cell 403 herein are equivalent to the operation voltage supply circuit 101 and the memory cell 103 in FIG. 1, respectively. As shown, the circuit structure shown in FIG. 4 is similar to that in FIG. 3. The main difference between the two circuit structures is that the operation voltage supply circuit 301 in FIG. 3 is constituted by one N-type transistor, two P-type transistors and two inverters but the operation voltage supply circuit 401 in FIG. 4 is constituted by three P-type transistors and two inverters. Specifically, in the operation voltage supply circuit 401, the P-type transistor P1 is configured to have one source/drain thereof electrically coupled to a source voltage VDD and another source/drain and a gate thereof electrically coupled to a node for generating an operation voltage Vcell. The P-type transistor P2 is configured to have one source/drain thereof electrically coupled to the node. The P-type transistor P3 is configured to have one source/drain thereof electrically coupled to another source/drain of the P-type transistor P2 and another source/drain thereof electrically coupled to the source voltage VDD. The inverter INV1 is configured to have an input terminal thereof electrically coupled to the bit line BL and an output terminal thereof electrically coupled to a gate of the P-type transistor P3. The inverter INV2 is configured to have an input terminal thereof electrically coupled to the complementary bit line BLB and an output terminal thereof electrically coupled to a gate of the P-type transistor P2.

The memory cell 403 has a circuit structure similar to that of the memory cell 203 in FIG. 2. As shown, the memory cell 403 includes two P-type transistors P4, P5 and four N-type transistor N1, N2, N3 and N4; wherein the operations and circuit connections of these components in the memory cell 403 can be obtained by referring to the description related to FIG. 2, and no redundant detail is to be given herein. In addition, it is to be noted that the P-type transistor P1 may be implemented by a general-threshold-voltage transistor, a high-threshold-voltage transistor or a low-threshold-voltage transistor. In this embodiment, the source voltage VDD is greater than the operation voltage Vcell; and the operation voltage Vcell is greater than the source voltage VSS.

Figure 5:
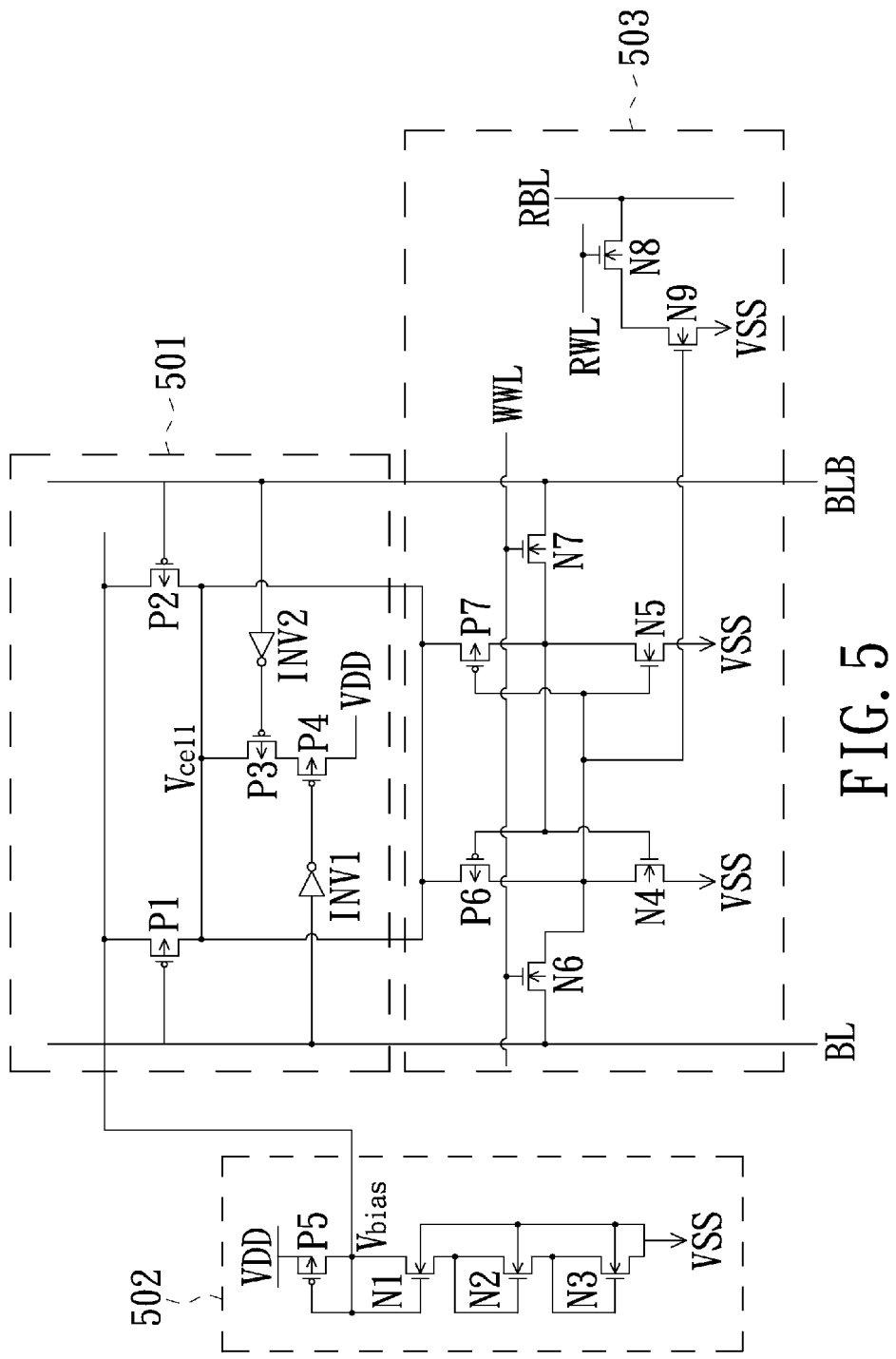
FIG. 5 is a schematic view of an operation voltage supply circuit and a respective memory cell in accordance with still yet another embodiment of the present invention.

FIG. 5 is a schematic diagram of an operation voltage supply circuit 501, a respective memory cell 503 and an associated bias voltage supply circuit 502 in accordance with still yet another embodiment of the present invention; wherein the operation voltage supply circuit 501 and the memory cell 503 herein are equivalent to the operation voltage supply circuit 101 and the memory cell 103 in FIG. 1, respectively. As shown, the main difference between the circuit structure in FIG. 5 and that in FIG. 2 is that the operation voltage supply circuit 501 in FIG. 5 is configured to receive a bias voltage Vbias (about 0.8×VDD) generated by the bias voltage supply circuit 502 and provide the operation voltage Vcell to the memory cell 503 when the memory cell 503 is selected.

Specifically, the operation voltage supply circuit 501 mainly includes four P-type transistors P1, P2, P3 and P4 and two inverters INV1 and INV2. The P-type transistors P1, P2 each are configured to have one source/drain thereof electrically coupled to the bias voltage Vbias and another source/drain thereof electrically coupled to the node in the operation voltage supply circuit 501 for generating an operation voltage Vcell. The P-type transistor P3 is configured to have one source/drain thereof electrically coupled to the node. The P-type transistor P4 is configured to have one source/drain thereof electrically coupled to another source/drain of the P-type transistor P3 and another source/drain thereof electrically coupled to the source voltage VDD. The inverter INV1 is configured to have an input terminal thereof electrically coupled to the bit line BL and an output terminal thereof electrically coupled to a gate of the P-type transistor P4. The inverter INV2 is configured to have an input terminal thereof electrically coupled to the complementary bit line BLB and an output terminal thereof electrically coupled to a gate of the P-type transistor P3.

The bias voltage supply circuit 502 mainly includes a P-type transistor P5 and three N-type transistors N1, N2 and N3. The P-type transistor P5 is configured to have one source/drain thereof electrically coupled to the source voltage VDD and another source/drain and a gate thereof electrically coupled to the node in the bias voltage supply circuit 502 for generating the aforementioned bias voltage Vbias. The N-type transistor N1 is configured to have one source/drain and a gate thereof electrically coupled to the node in the bias voltage supply circuit 502. The N-type transistor N2 is configured to have one source/drain and a gate thereof electrically coupled to another source/drain of the N-type transistor N1. The N-type transistor N3 is configured to have one source/drain and a gate thereof electrically coupled to another source/drain of the N-type transistor N2 and another source/drain thereof electrically coupled to the source voltage VSS. In this embodiment, the N-type transistors N1, N2 and N3 all are configured to have the substrates thereof electrically coupled to the source voltage VSS.

The memory cell 503 mainly includes two P-type transistors P6, P7 and sixth N-type transistor N4, N5, N6, N7, N8 and N9. The P-type transistors P6, P7 each are configured to have one source/drain thereof electrically coupled to the node in the operation voltage supply circuit 501 from which to receive the operation voltage Vcell. The N-type transistor N4 is configured to have one source/drain thereof electrically coupled to another source/drain of the P-type transistor P6, another source/drain thereof electrically coupled to the source voltage VSS, and a gate thereof electrically coupled to a gate of the P-type transistor P6. The N-type transistor N5 is configured to have one source/drain thereof electrically coupled to another source/drain of the P-type transistor P7, another source/drain thereof electrically coupled to the source voltage VSS, and a gate thereof electrically coupled to a gate of the P-type transistor P7. The N-type transistor N6 is configured to have one source/drain thereof electrically coupled to the bit line BL, another source/drain thereof electrically coupled to one source/drain of the N-type transistor N4 and a gate of the N-type transistor N5, and a gate thereof electrically coupled to the write word line WWL. The N-type transistor N7 is configured to have one source/drain thereof electrically coupled to the complementary bit line BLB, another source/drain thereof electrically coupled to one source/drain of the N-type transistor N5 and a gate of the N-type transistor N4, and a gate thereof electrically coupled to the write word line WWL. The N-type transistor N8 is configured to have one source/drain thereof electrically coupled to a read bit line RBL and a gate thereof electrically coupled to a read word line RWL. The N-type transistor N9 is configured to have one source/drain thereof electrically coupled to another source/drain of the N-type transistor N8, another source/drain thereof electrically coupled to the source voltage VSS, and a gate thereof electrically coupled to a gate of the N-type transistor N4. In this embodiment, the source voltage VDD is greater than the bias voltage Vbias, the operation voltage Vcell and the source voltage VSS; the bias voltage Vbias is equal to the operation voltage Vcell; and the bias voltage Vbias and the operation voltage Vcell both are greater than the source voltage VSS.

Figure 6:
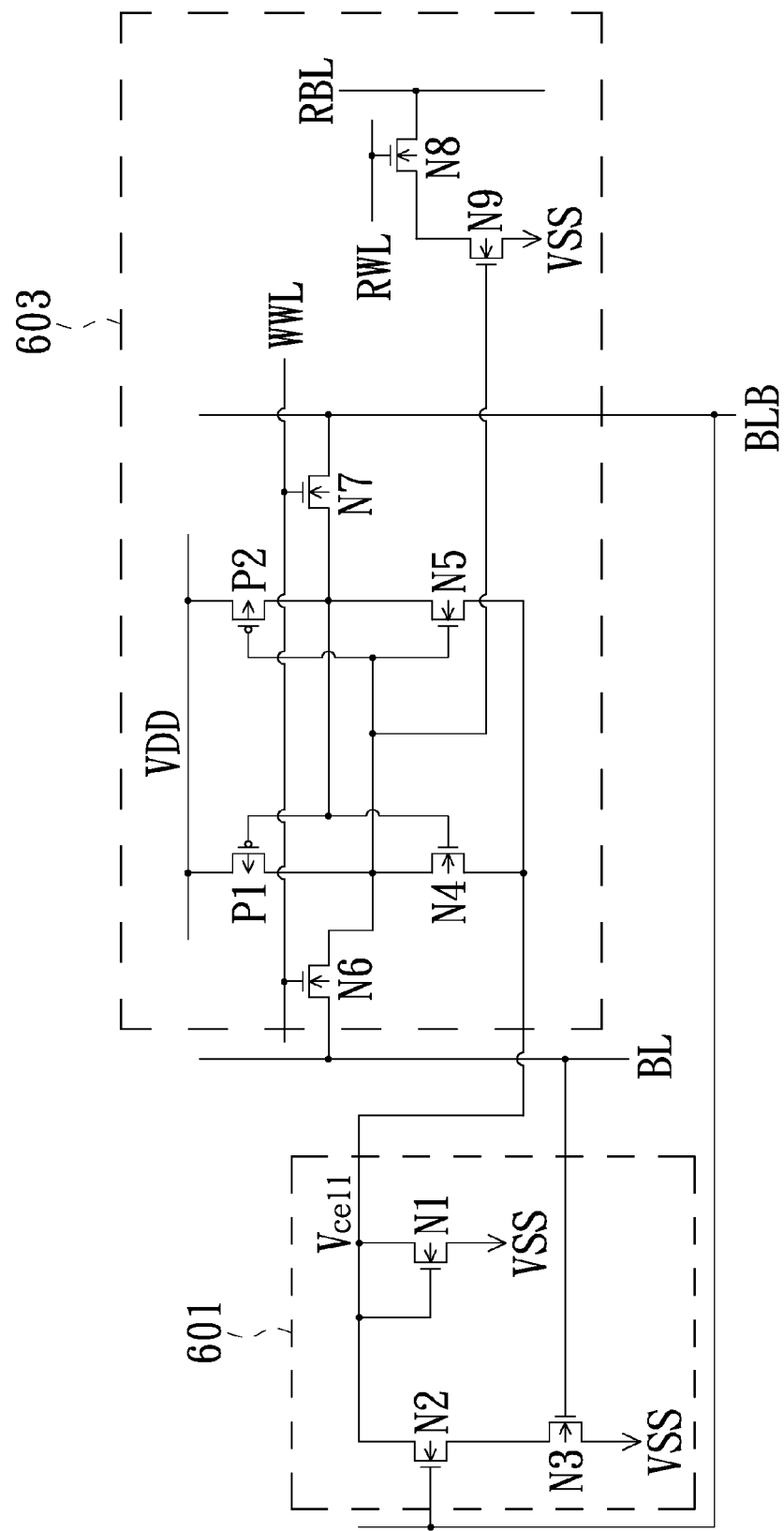
FIG. 6 is a schematic view of an operation voltage supply circuit and a respective memory cell in accordance with another further embodiment of the present invention.

FIG. 6 is a schematic diagram of an operation voltage supply circuit 601 and a respective memory cell 603 in accordance with another further embodiment of the present invention; wherein the operation voltage supply circuit 601 and the memory cell 603 herein are equivalent to the operation voltage supply circuit 101 and the memory cell 103 in FIG. 1, respectively. As shown, the operation voltage supply circuit 601 in this embodiment mainly includes three N-type transistors N1, N2 and N3. The N-type transistor N1 is configured to have one source/drain and a gate thereof electrically coupled to a node for generating the operation voltage Vcell and another source/drain thereof electrically coupled to the source voltage VSS. The N-type transistor N2 is configured to have one source/drain thereof electrically coupled to the aforementioned node and a gate thereof electrically coupled to the complementary bit line BLB. The N-type transistor N3 is configured to have one source/drain thereof electrically coupled to another source/drain of the N-type transistor N2, another source/drain thereof electrically coupled to the source voltage VSS, and a gate thereof electrically coupled to the bit line BL.

The memory cell 603 mainly includes two P-type transistors P1, P2 and sixth N-type transistor N4, N5, N6, N7, N8 and N9. The P-type transistors P1, P2 each are configured to have one source/drain thereof electrically coupled to the source voltage VDD. The N-type transistor N4 is configured to have one source/drain thereof electrically coupled to another source/drain of the P-type transistor P1, another source/drain thereof electrically coupled to a node in the operation voltage supply circuit 601 from which to receive the operation voltage Vcell, and a gate thereof electrically coupled to a gate of the P-type transistor P1. The N-type transistor N5 is configured to have one source/drain thereof electrically coupled to another source/drain of the P-type transistor P2, another source/drain thereof electrically coupled to the node in the operation voltage supply circuit 601 from which to receive the operation voltage Vcell, and a gate thereof electrically coupled to a gate of the P-type transistor gate P2. The N-type transistor N6 is configured to have one source/drain thereof electrically coupled to the bit line BL, another source/drain thereof electrically coupled to one source/drain of the N-type transistor N4 and a gate of the N-type transistor N5, and a gate thereof electrically coupled to the write word line WWL. The N-type transistor N7 is configured to have one source/drain thereof electrically coupled to the complementary bit line BLB, another source/drain thereof electrically coupled to one source/drain of the N-type transistor N5 and a gate of the N-type transistor N4, and a gate thereof electrically coupled to the write word line WWL. The N-type transistor N8 is configured to have one source/drain thereof electrically coupled to a read bit line RBL and a gate thereof electrically coupled to a read word line RWL. The N-type transistor N9 is configured to have one source/drain thereof electrically coupled to another source/drain of the N-type transistor N8, another source/drain thereof electrically coupled to the source voltage VSS, and a gate thereof electrically coupled to a gate of the N-type transistor N5 and another source/drain of the N-type transistor N4. In this embodiment, the source voltage VDD is greater than the operation voltage Vcell; and the operation voltage Vcell is greater than the source voltage VSS.

The memory cell 603 in the aforementioned description of the another further embodiment is exemplified by eight transistors. However, it is understood that the memory cell 603 in another different embodiment may be implemented by six transistors; in other words, the memory cell 603 may include just two P-type transistors P1 P2 and four N-type transistors, N4, N5, N6 and N7.

Figure 7:
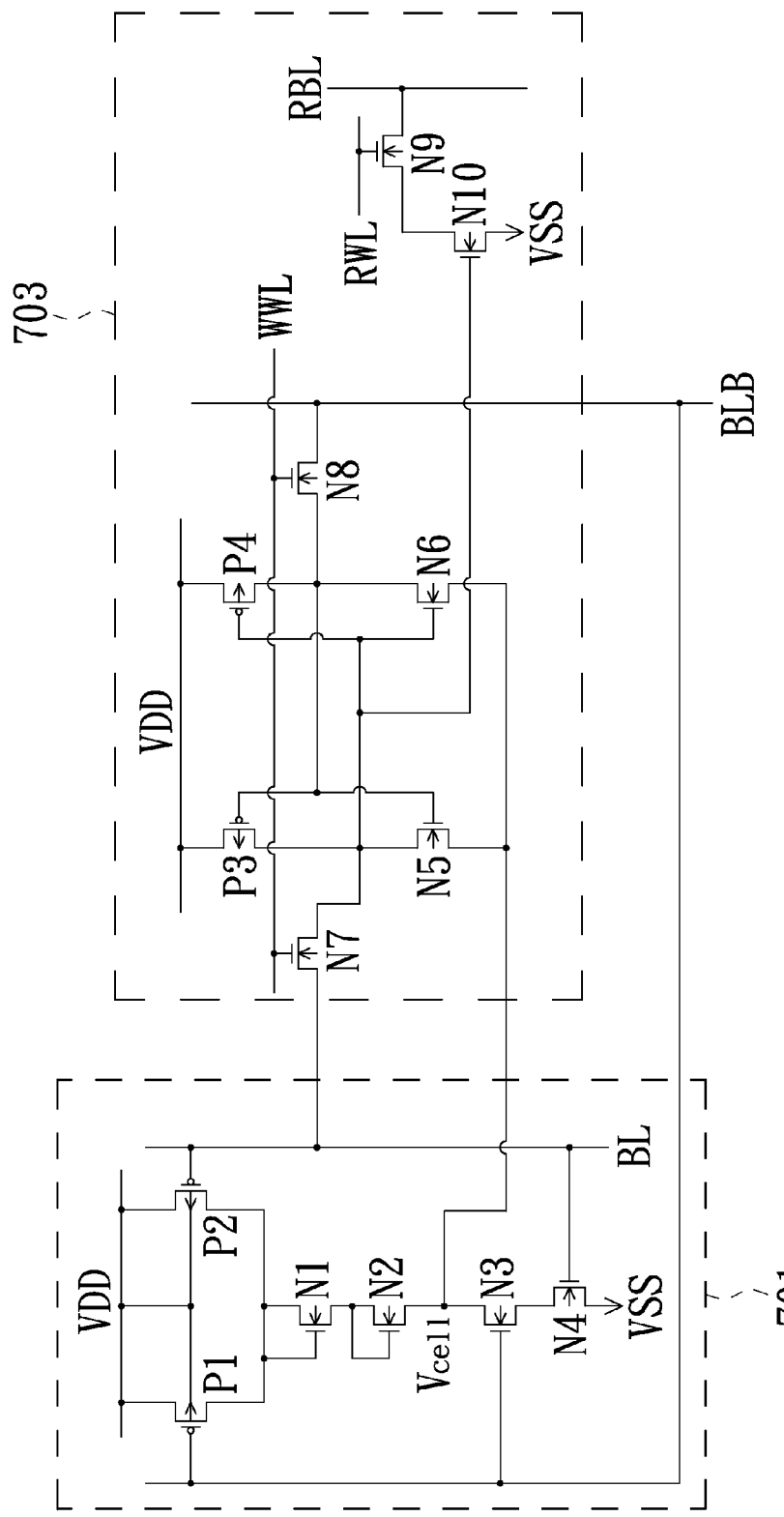
FIG. 7 is a schematic view of an operation voltage supply circuit and a respective memory cell in accordance with another yet further embodiment of the present invention.

FIG. 7 is a schematic diagram of an operation voltage supply circuit 701 and a respective memory cell 703 in accordance with another yet further embodiment of the present invention; wherein the operation voltage supply circuit 701 and the memory cell 703 herein are equivalent to the operation voltage supply circuit 101 and the memory cell 103 in FIG. 1, respectively. As shown, the circuit structure shown in FIG. 7 is similar to that in FIG. 6. The main difference between the two circuit structures is that the operation voltage supply circuit 601 in FIG. 6 is constituted by three N-type transistors but the operation voltage supply circuit 701 in FIG. 7 is constituted by two P-type transistor and four N-type transistors. Specifically, the P-type transistor P1 is configured to have one source/drain and a substrate thereof electrically coupled to a source voltage VDD and a gate thereof electrically coupled to the complementary bit line BLB. The P-type transistor P2 is configured to have one source/drain and a substrate thereof electrically coupled to the source voltage VDD, another source/drain thereof electrically coupled to another source/drain of the P-type transistor P1, and a gate thereof electrically coupled to the bit line BL. The N-type transistor N1 is configured to have one source/drain and a gate thereof electrically coupled to each of another source/drain of the P-type transistors P1, P2. The N-type transistor N2 is configured to have one source/drain and a gate thereof electrically coupled to another source/drain of the N-type transistor N1 and another source/drain thereof electrically coupled to a node for generating the operation voltage Vcell. The N-type transistor N3 is configured to have one source/drain thereof electrically coupled to the node and a gate thereof electrically coupled to the complementary bit line BLB. The N-type transistor N4 is configured to have one source/drain electrically coupled to another source/drain of the N-type transistor N3, another source/drain thereof electrically coupled to the source voltage VSS, and a gate thereof electrically coupled to the bit line BL.

The memory cell 703 has a circuit structure similar to that of the memory cell 603 in FIG. 6. As shown, the memory cell 703 includes two P-type transistors P3, P4 and six N-type transistor N5, N6, N7, N8, N9 and N10; wherein the operations and circuit connections of these components in the memory cell 703 can be obtained by referring to the description related to FIG. 6, and no redundant detail is to be given herein. In this embodiment, the source voltage VDD is greater than the operation voltage Vcell; and the operation voltage Vcell is greater than the source voltage VSS.

The memory cell 703 in the aforementioned description of the another yet further embodiment is exemplified by eight transistors. However, it is understood that the memory cell 703 in this embodiment may be instead, be implemented by just six transistors; in other words, the memory cell 703 may just include two P-type transistors P3, P4 and four N-type transistors, N5, N6, N7 and N8.

In summary, by dividing the memory cells in the same column of a memory cell array into at least two groups of memory cells, configuring one of the two groups of memory cells to receive an operation voltage provided by one of the at least two groups of operation voltage supply circuits in the memory cell array, and configuring the other one of the two groups of memory cells to receive an operation voltage provided by the other one of the at least two groups of operation voltage supply circuits in the memory cell array, the memory cell array of the present invention employing the aforementioned circuit structure not only can reduce the impact of the IR-Drop on the memory cells but also enhance the static noise margin (SNM) of the memory cells.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A memory cell array, comprising:
a bit line;
a complementary bit line;

a first operation voltage supply circuit, electrically coupled to the bit line and the complementary bit line, configured to provide a first operation voltage;

a second operation voltage supply circuit, electrically coupled to the bit line and the complementary bit line, configured to provide a second operation voltage;

a first memory cell, electrically coupled to the bit line and the complementary bit line, configured to receive the first operation voltage; and a second memory cell, electrically coupled to the bit line and the complementary bit line, configured to receive the second operation voltage;

wherein the first and second memory cells are located in a same column in the memory cell array;

wherein the first and second operation voltage supply circuits both comprise:

a node for generating the first or the second operation voltage;

a first N-type transistor configured to have one source/drain thereof electrically coupled to a first source voltage and another source/drain thereof electrically coupled to the node;

a second N-type transistor configured to have one source/drain thereof electrically coupled to the first source voltage and another source/drain thereof electrically coupled to the node;

a first P-type transistor configured to have one source/drain thereof electrically coupled to the node and a gate thereof electrically coupled to a gate of the second N-type transistor;

a second P-type transistor configured to have one source/drain thereof electrically coupled to another source/drain of the first P-type transistor, another source/drain thereof electrically coupled to the first source voltage, and a gate thereof electrically coupled to a gate of the first N-type transistor;

a first inverter configured to have an input terminal thereof electrically coupled to the bit line and an output terminal thereof electrically coupled to a gate of the second P-type transistor; and a second inverter configured to have an input terminal thereof electrically coupled to the complementary bit line and an output terminal thereof electrically coupled to a gate of the first P-type transistor;

wherein the first operation voltage or the second operation voltage at the node is equal to or smaller than the first source voltage.

2. The memory cell array according to claim 1, wherein both of the first and second N-type transistors are a low-threshold-voltage transistor.

3. The memory cell array according to claim 1, wherein both of the first and second N-type transistors are a high-threshold-voltage transistor.

4. The memory cell array according to claim 1, wherein both of the first and second N-type transistors are a general-threshold-voltage transistor.

5. The memory cell array according to claim 1, further comprising:

at least a write word line electrically coupled to the first memory cell or the second memory cell.

* * * * *